(12) United States Patent
Joblot et al.

(10) Patent No.: US 8,994,172 B2
(45) Date of Patent: Mar. 31, 2015

(54) CONNECTION OF A CHIP PROVIDED WITH THROUGH VIAS

(71) Applicant: STMicroelectronics SA, Montrouge (FR)

(72) Inventors: Sylvain Joblot, Bizonnes (FR); Pierre Bar, Grenoble (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 13/873,103

(22) Filed: Apr. 29, 2013

(65) Prior Publication Data

US 2013/0292824 A1 Nov. 7, 2013

(30) Foreign Application Priority Data

May 3, 2012 (FR) .................................. 12 54061

(51) Int. Cl.
*H01L 23/48* (2006.01)
*H01L 23/28* (2006.01)
*H01L 21/768* (2006.01)
*H01L 23/538* (2006.01)
*H01L 23/14* (2006.01)
*H01L 23/498* (2006.01)
*H01L 21/48* (2006.01)

(52) U.S. Cl.
CPC .............. *H01L 23/28* (2013.01); *H01L 23/481* (2013.01); *H01L 21/76877* (2013.01); *H01L 23/5384* (2013.01); *H01L 23/147* (2013.01); *H01L 23/49822* (2013.01); *H01L 21/486* (2013.01); *H01L 2224/32225* (2013.01); *H01L 2224/73204* (2013.01); *H01L 2224/16145* (2013.01); *H01L 2224/32145* (2013.01); *H01L 2224/16227* (2013.01); *H01L 2224/16225* (2013.01)
USPC ........... 257/737; 257/774; 257/698; 438/675; 438/667

(58) Field of Classification Search
CPC . H01L 23/5384; H01L 23/28; H01L 23/5329; H01L 21/76877
USPC ................... 257/737, 774, 698; 438/675, 667
See application file for complete search history.

(56) References Cited

U.S. PATENT DOCUMENTS

| | | |
|---|---|---|
| 2005/0248002 A1 | 11/2005 | Newman et al. |
| 2008/0299762 A1 | 12/2008 | Mathew et al. |
| 2009/0206488 A1 | 8/2009 | Lindgren et al. |
| 2010/0123256 A1* | 5/2010 | Yoda et al. .................... 257/774 |
| 2011/0095435 A1* | 4/2011 | Volant et al. .................. 257/774 |
| 2011/0108988 A1 | 5/2011 | Lim et al. |
| 2011/0291267 A1 | 12/2011 | Wang et al. |
| 2013/0140690 A1* | 6/2013 | Lin et al. ........................ 257/737 |

OTHER PUBLICATIONS

M. Bouchoucha et al, "Reliability Study of 3D-WLP Through Silicon Via with Innovative Polymer Filling Integration", IEEE Conference ECTC 2011, pp. 567-572.

* cited by examiner

*Primary Examiner* — Tu-Tu Ho
(74) *Attorney, Agent, or Firm* — Seed IP Law Group PLLC

(57) ABSTRACT

A chip provided with through vias wherein the vias are formed of an opening with insulated walls coated with a conductive material and filled with an easily deformable insulating material, elements of connection to another chip being arranged in front of the easily deformable insulating material.

19 Claims, 2 Drawing Sheets

CONNECTION OF A CHIP PROVIDED WITH THROUGH VIAS

BACKGROUND

1. Technical Field

The present disclosure relates to the field of so-called three-dimensional integrated circuits, comprising a superposition of chips and other elements to provide interconnections and increase the integration density.

2. Description of the Related Art

FIG. 1 shows an example of such a three-dimensional structure, intended to connect one or several semiconductor chips containing integrated circuits to a printed circuit board.

In this example, two integrated circuit chips 1 and 2 assembled with an interposer 4 on a support 6, such as a ceramic, a polymer, a portion of printed circuit board or the like, are shown. The lower surface of support 6 supports connection elements, such as bumps 8, intended to provide a connection with a step between them compatible with the size and the location of the connection areas of a printed circuit board, not shown, on which the component must be assembled and to which it must be connected.

Each chip 1, 2 comprises, on its lower surface, an interconnection network formed of several metallization levels intended to connect points of the chip surface together and to pads located on the last metallization level. Each of these pads is connected by connection means such as metal pillars 10, for example, made of copper, to similar pads of the upper surface of an intermediate plate or interposer 4 having its upper and lower surfaces generally covered with an interconnection network. Interposer plate 4 comprises through vias 12, each of which is connected to one of the pads of the upper surface of this plate and to a pad of the lower surface of this plate, to redistribute the connections with the narrow step between connection elements 10 towards other connection elements 14 on the lower surface side of plate 4 with a wider step adapted to the possible step of the connections on support 6. Support 6 also comprises interconnection networks 16, 17 on its upper and lower surfaces, respectively, the pads of interconnection network 16 being connected to connection elements such as pillars 14 and the pads of interconnection network 17 being connected to pads for receiving bumps 8.

Many variations of such a structure are possible. For example, one or several chips may be provided instead of two integrated circuit chips 1 and 2. In one embodiment, at least one chip is used as a support for one or more other integrated circuit chips.

A difficulty with such assemblies is a possible lack of reliability over time. Indeed, support 6 and interposer plate 4, the latter being generally made of silicon, have different expansion coefficients. Thus, when this assembly is heated, lateral stress is exerted on connection elements 14 of interconnection network 16, whereby these elements or the weldings connecting them to the support and to the interposer plate risk cracking and altering the quality of the connections.

It is desirable to improve reliability of existing three-dimensional structures.

BRIEF SUMMARY

An embodiment provides a chip provided with through vias wherein the vias are formed of an opening with insulated walls coated with a conductive material and filled with an easily deformable insulating material, elements of connection to another chip being arranged in front of the easily deformable insulating material.

According to an embodiment, the conductive material is copper.

According to an embodiment, the easily deformable insulating material is a polymer of polysiloxane type.

According to an embodiment, the connection elements are metal pads or areas intended to be connected to bumps.

According to an embodiment, the connection elements are pillars of a conductive material such as copper.

According to an embodiment, the connection elements are pillars of a conductive material such as copper and/or metal pads or areas intended to be connected to bumps.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

For clarity, the same elements have been designated with the same reference numerals in the different drawings and, further, as usual in the representation of integrated circuits, the various drawings are not to scale.

DETAILED DESCRIPTION

Figure 1:
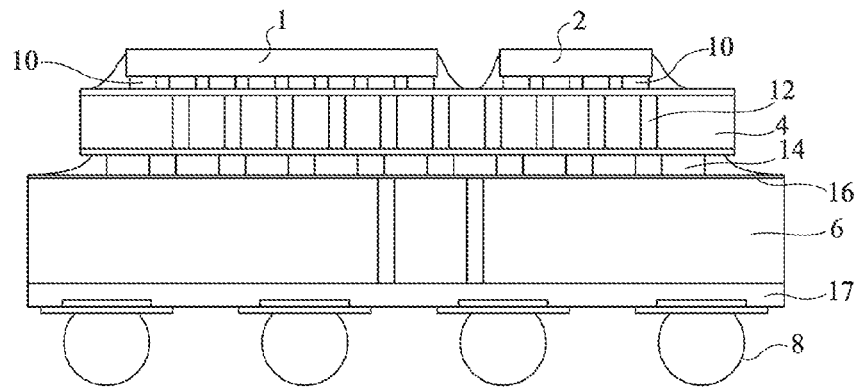
FIG. 1, previously described, is a simplified cross-section view of three-dimensional chip assembly.

It can be observed that at least one of the chips forming a three-dimensional assembly, such as the assembly of FIG. 1, essentially comprises through vias. The following description will be given in the case where the considered chip is a silicon interposer chip, such as plate or chip 4 of FIG. 1, but it should be noted that the following may apply to any chip comprising vias, interposed between other chips to which it is connected.

Figure 2:
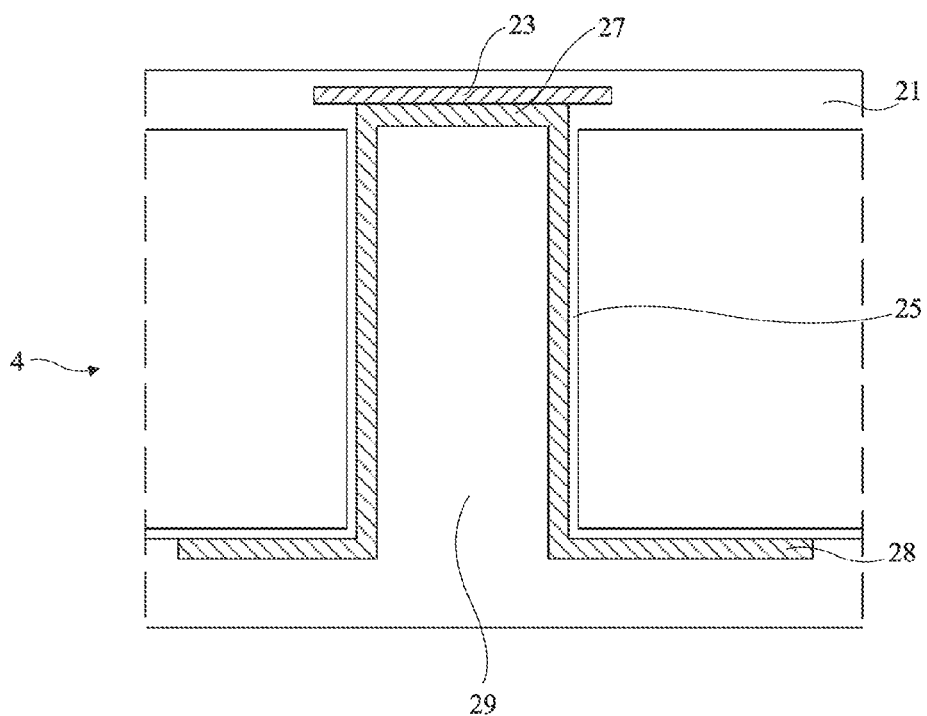
FIG. 2 is an enlarged cross-section view of an embodiment of a via crossing a chip.

FIG. 2 is an enlarged cross-section view of a portion of chip 4 of FIG. 1. The case where a via crossing this chip is formed by using the following step sequence is considered in the present example.

The upper chip surface is coated with an insulating layer 21 in where metal interconnection levels (not shown) are formed, at least one metallization 23 being arranged in front of the location where the via is desired to be formed.

An opening is drilled from the lower surface of the chip, which is then possibly maintained by a handle attached to its upper surface if it is a highly thinned chip. This opening is drilled all the way to metallization 23.

The opening walls are lined with an insulating layer 25, in the case where chip 4 is made of a conductive material, which is the case in the selected example where this chip is made of silicon.

A conductive material 27, copper in a preferred embodiment, is conformally deposited. This copper deposition is performed in any conventional manner. It is generally preceded by the deposition of a bonding layer made of Ti, TiN, Ta, TaN, or other.

Portion 28 of the copper deposition located on the lower surface is etched to delimit it.

What remains of the opening is filled with a material 29 which also covers the lower chip surface.

Material 29 is selected to be an easily deformable material, that is, a ductile material with a low Young's modulus, or a resilient material of low stiffness (see M. Bouchoucha et al, IEEE Conference ECTC 2011, pp. 567-572). Material 29 has for example a Yong's modulus E between about 0.1 GPa and about 4 GPa, and for example between about 0.5 GPa and about 2 GPa. A polysiloxane-type polymer such as the product sold under trade name "SINR" may for example be used.

The thickness of chip 4 and the dimensions of the via may vary within large proportions according to the assembly which is desired to be formed and to the components with which chip 4 is desired to be assembled. As an example, chip 4 may have a thickness ranging from 50 to 300 µm or more. The via may have lateral dimensions approximately ranging from 10 to 15 µm. Insulating layer 25 may be a silicon oxide layer having a thickness ranging from 0.2 to 1 µm. Copper layer 27 may have a thickness ranging from 0.5 to 3 µm. This layer may be deposited to have a larger thickness at the bottom of the via than on its walls.

Figure 3:
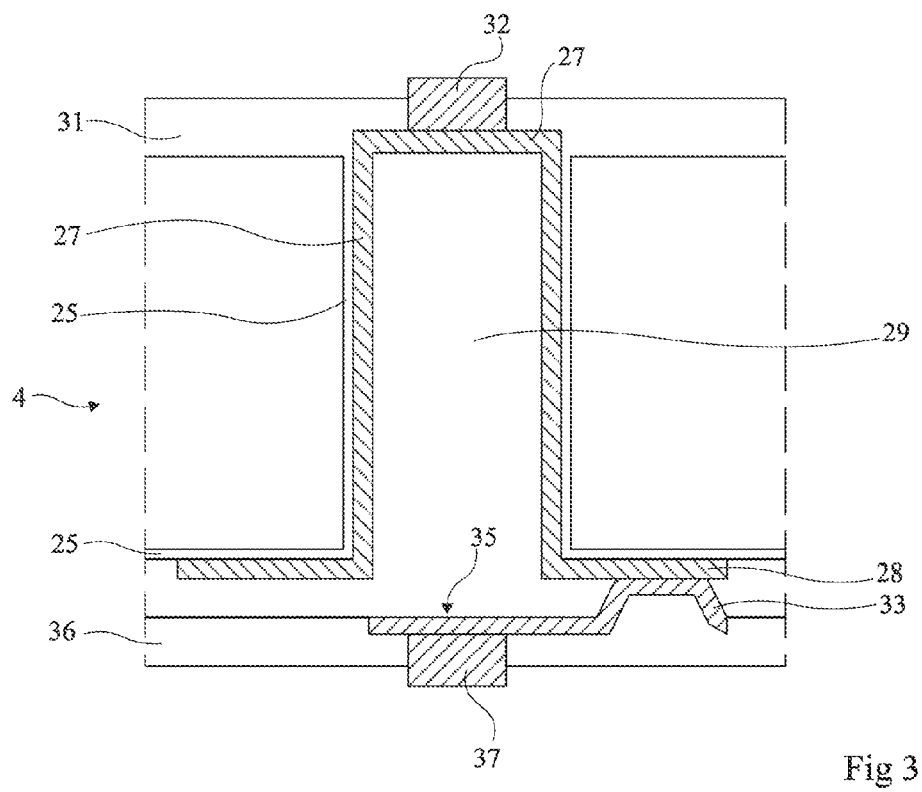
FIG. 3 is an enlarged cross-section view of an embodiment of a via crossing a chip associated with upper and lower connection means.

FIG. 3 is a cross-section view similar to the representation of FIG. 2 illustrating an embodiment of means of connection to another chip. The case where a via crossing this chip is formed by using the following succession of steps is considered in this example.

A hole is drilled from the upper surface of the chip which has not been thinned.

The hole walls are lined with an insulating layer 25, in the case where wafer 4 is made of a conductive material, which is the case in the selected example where this chip is made of silicon.

A conductive material 27, copper in a preferred embodiment, is conformally deposited. This copper deposition is performed in any conventional manner. It is generally preceded by the deposition of a bonding layer made of Ti, TiN, Ta, TaN, or other.

Portion 28 of the copper deposition located on the upper surface is etched to delimit it.

What remains of the opening is filled with a material 29 which also covers the upper surface of the wafer.

On the upper surface side of wafer 4, a connection 33, associated with one or several metallization levels connecting conductor 28 formed on this upper surface to an area 35 arranged in front of the via has been provided. Another protection layer 36, preferably made of the same material as material 29 filling the via and formed and opened in front of the center of the via is deposited to form, preferably by electrolytic growth, a copper pad or pillar 37 on area 35.

The lower surface of wafer 4 is then thinned and etched to expose the portion of conductive layer 27 corresponding to the bottom of the via.

A protection layer 31, preferably made of the same deformable material as material 29 filling the via, is then deposited.

Openings provided in layer 31 then enable to form connection pads 32.

Thus, if areas, pads, or pillars 32 and 37 are submitted to lateral displacement stress, such stress can be absorbed by easily deformable material 29. The thicknesses and the shapes of metallizations 27 and 33 will be selected so that these metallizations can follow the imposed motion.

Of course, FIG. 3 is a possible embodiment only of a structure. Elements 32 and 37 may, as indicated previously, be pillars having their external surface intended to be welded to the external surface of a corresponding pad of a chip to be assembled with chip 4. Elements 32 and 37 may also be connection areas intended to be welded to bumps, etc. with which a lateral deformation issue due to thermal variations or others is raised.

The width of pads 32, 37 is selected to be smaller than the lateral dimensions of the filling with deformable material 29. The larger the width difference, the more the device will be able to absorb lateral (or axial) stress capable of occurring during the different steps of assembly and of aging of the final unit. Of course, such dimensions will be selected according to currently-used techniques and to integration imperatives.

The foregoing is the description of specific embodiments of a through via associated with connection elements. Generally, a chip provided with through vias formed of a conductor coating the lateral walls of an opening is here considered, the opening being filled with an easily deformable material 29. Generally, it is here provided to arrange elements of connection between a chip provided with such through vias and other chips. The connection elements are arranged above and/or under each via and more specifically above and/or under an easily deformable material 29 filling these vias. Thus, if the connection elements are submitted to lateral or axial stress, said stress will be absorbed by a displacement of the easily deformable material.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A device comprising:
a substrate that includes a through via defined by sidewalls;
a conductive material on the sidewalls of the through via;
a deformable insulating material located on the conductive material and filling the through via, the deformable insulating material having a central axis and a first width that is perpendicular to the central axis; and
connection elements arranged at opposite ends of the deformable insulating material and substantially about the central axis of the deformable insulating material, the connection elements having a second width that is parallel to the first width of the deformable insulating material, the second width being less than first width of the deformable insulating material.

2. The device of claim 1, wherein said conductive material is copper.

3. The device of claim 1, wherein said deformable insulating material is a polysiloxane polymer.

4. The device of claim 1, wherein the connection elements are pads or metal areas configured to be connected to bumps.

5. The device of claim 1, wherein the connection elements are pillars of a conductive material.

6. The device of claim 1, wherein the connection elements are pillars of copper configured to be connected to bumps.

7. The device of claim 1, wherein at least some of the conductive material extends beyond the through via.

8. The device of claim 7, wherein the connection elements are coupled to the conductive material that extends beyond the through via.

9. The device of claim 1, wherein the substrate is silicon.

10. The device of claim 1, further comprising an insulating layer located on the sidewalls of the through via under the conductive material.

11. A method comprising:
forming through holes in a substrate, each through hole having sidewalls;
forming a conductive layer on the sidewalls in the through holes;
filling each of the through holes with a deformable insulating material that is located over the conductive material in the through holes, the deformable insulating material having a central axis and a first width that is perpendicular to the central axis; and
forming a connection element at each end of the through hole and facing the deformable insulating material, the connection elements having a second width that extends in a direction that is parallel to the first width, the second width being less than the first width.

12. The method of claim 11, wherein the substrate is silicon.

13. The method of claim 11, wherein prior to forming the conductive layer in the through holes, depositing an insulating layer on the sidewalls of the through holes.

14. The method of claim 11, wherein forming the conductive layer in the through holes comprises depositing the conductive material in the through holes and causing portions to extend beyond the through hole, each connection element being coupled to the portions of the conductive material that extends beyond the through hole.

15. An assembly comprising:
an integrated circuit device having a plurality of bond pads on an upper surface;
a substrate having a first surface and a second surface and having a through via defined by sidewalls, the through via having a central axis;
a conductive material over the sidewalls of the through via;
a deformable insulating material over the conductive material and filling the through via, the deformable insulating material having a first width that is perpendicular to the central axis; and
a respective connection element located at each end of the through hole at the first surface and the second surface of the substrate and facing the deformable insulating material, the connection element at the first surface being electrically coupled to a respective bond pad of the integrated circuit, each of the respective connection elements having a second width that is parallel to and less than the first width of the deformable insulating material.

16. The assembly of claim 15, wherein the substrate is silicon.

17. The assembly of claim 15, wherein the sidewalls of the through via comprise an insulated layer deposited along the sidewalls of the through via below the conductive material.

18. The assembly of claim 15, wherein the deformable insulating material is a polymer.

19. The assembly of claim 18, wherein the polymer is polysiloxane.

* * * * *